(12) United States Patent
Endoh et al.

(10) Patent No.: US 11,417,378 B2
(45) Date of Patent: Aug. 16, 2022

(54) INTEGRATED CIRCUIT DEVICE

(71) Applicant: TOHOKU UNIVERSITY, Miyagi (JP)

(72) Inventors: Tetsuo Endoh, Miyagi (JP); Shoji Ikeda, Miyagi (JP); Hiroki Koike, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 17/043,257

(22) PCT Filed: Mar. 12, 2019

(86) PCT No.: PCT/JP2019/010003
§ 371 (c)(1),
(2) Date: Dec. 22, 2020

(87) PCT Pub. No.: WO2019/188252
PCT Pub. Date: Oct. 3, 2019

(65) Prior Publication Data
US 2021/0110857 A1  Apr. 15, 2021

(30) Foreign Application Priority Data

Mar. 30, 2018 (JP) .............................. JP2018-070349

(51) Int. Cl.
| | | |
|---|---|---|
| G11C 11/16 | (2006.01) | |
| G11C 13/00 | (2006.01) | |
| H01L 43/02 | (2006.01) | |

(52) U.S. Cl.
CPC ........ *G11C 11/161* (2013.01); *G11C 13/0069* (2013.01); *H01L 43/02* (2013.01); *G11C 2211/5615* (2013.01)

(58) Field of Classification Search
None
See application file for complete search history.

(56) References Cited

U.S. PATENT DOCUMENTS

| | | | |
|---|---|---|---|
| 2005/0087785 A1 | 4/2005 | Lu | |
| 2010/0019297 A1* | 1/2010 | Hwang | .................. H01L 43/08 257/E27.005 |
| 2013/0044537 A1* | 2/2013 | Ishigaki | .................. H01L 43/12 365/158 |

FOREIGN PATENT DOCUMENTS

| | | |
|---|---|---|
| JP | 2002359355 A | 12/2002 |
| JP | 2008227009 A | 9/2008 |

(Continued)

OTHER PUBLICATIONS

International Search Report issued in PCT/JP019/01003 dated Jun. 11, 2019.

*Primary Examiner* — James G Norman
(74) *Attorney, Agent, or Firm* — Fox Rothschild LLP; Robert J. Sacco; Carol E. Thorstad-Forsyth

(57) ABSTRACT

An integrated circuit device of the invention, includes: a first resistance variable memory element provided on a semiconductor substrate; a second resistance variable memory element provided on the semiconductor substrate; and a semiconductor circuit for controlling write and read of the first resistance variable memory element and the second resistance variable memory element, which is provided on the semiconductor substrate, in which the second resistance variable memory element has a write current that is smaller than a write current of the first resistance variable memory element, and the second resistance variable memory element is disposed farther from the semiconductor substrate than the first resistance variable memory element.

11 Claims, 8 Drawing Sheets

(56) References Cited

FOREIGN PATENT DOCUMENTS

| WO | 2011087038 A1 | 7/2011 |
|---|---|---|
| WO | 2016159017 A1 | 10/2016 |

\* cited by examiner

INTEGRATED CIRCUIT DEVICE

CROSS-REFERENCE TO RELATED APPLICATIONS

The present application is a U.S. National Phase of International Patent Application No. PCT/JP2019/010003, filed on Mar. 12, 2019, which claims the benefit and priority of Japanese Patent Application No. 2018-070349 filed on Mar. 30, 2018. The contents of the above applications are incorporated herein by reference in their entirety.

TECHNICAL FIELD

The present invention relates to an integrated circuit device including a resistance variable memory element.

BACKGROUND ART

A resistance variable memory storing data in accordance with a high or low in the resistance of an element has been known. Examples of the resistance variable memory include a resistive random access memory (ReRAM) including a resistance variable memory element of which electrical resistance is changed in accordance with a change in electric-field induced colossal resistance, a phase change memory, and a magnetic random access memory (MRAM) including a magnetic tunnel junction element in which a tunnel magnetoresistance effect is used as a resistance variable memory element.

An integrated circuit device including the resistance variable memory element such as the MRAM described above is combined with a circuit element of a semiconductor such as a MOSFET by a CMOS process, in order to perform the write and read of data with respect to the element. In such an integrated circuit device, the resistance variable memory element is formed on a metal wiring layer of a semiconductor substrate on which the circuit element of the semiconductor is formed (for example, refer to International Publication WO 2016/159017).

CITATION LIST

Patent Literature

Patent Literature 1: WO 2016/159017

SUMMARY OF INVENTION

Technical Problem

In the integrated circuit device in which a battery is used as a power supply, in particular, in a mobile product, a ubiquitous product, or the like, a reduction in the current consumption is a highest-priority issue. In addition, an operation speed of the integrated circuit device is required to be as high as that of a high-end product, in accordance with multi-functionalization for the same application. The resistance variable memory element is a nonvolatile memory, and thus, has attracted attention as a memory element having low power consumption and a high operation speed, compared to a DRAM or the like that is required to be refreshed, and has been researched/developed in various places.

However, individual studies have been conducted with respect to the resistance variable memory element, and the operation speed or the size reduction thereof so far, but no study has been conducted with respect to an operation efficiency of the whole integrated circuit device. The problem of power consumption or the problem of a data processing speed is in a stage of being studied in detail. In addition, it is desirable to dispose the resistance variable memory element in a multi-layer state by focusing on high integration, and to increase the operation efficiency in the integrated circuit device in which the resistance variable memory element is in a multi-layer state. Note that, the operation efficiency is used as a broad index including not only an individual performance index for evaluating the power consumption, the operation speed, or the like of the element itself, but also the power consumption or the operation speed of the whole integrated circuit device, signal quality, consistency with a peripheral circuit, and the like.

An object of the invention is to provide an integrated circuit device in which a resistance variable memory element is disposed in a multi-layer state, in consideration of an operation efficiency.

Solution to Problem

A write operation speed of the resistance variable memory element is not determined only by the operation speed of an element single body, but it is necessary to consider the influence of a wiring delay. The present inventors have found that the wiring delay is inseparably connected with a wiring length, that is, the multi-layer disposition of the resistance variable memory element, and the operation efficiency is highly affected by a multi-layer disposition configuration of the resistance variable memory element. In addition, the power consumption is inseparably connected with not only low current consumption of the memory cell single body including the resistance variable memory element, but also a dynamic distribution ratio of a current amount to be supplied to each module mounted on the integrated circuit device, in the whole integrated circuit device. The present inventors have found that in the amount of current consumption, the operation efficiency is highly affected by a current distribution with respect to each layer of the resistance variable memory element that is disposed in a multi-layer state. The invention is based on such findings.

An integrated circuit device of the invention, includes: a first resistance variable memory element provided on a semiconductor substrate; a second resistance variable memory element provided on the semiconductor substrate; and a semiconductor circuit for controlling write and read of the first resistance variable memory element and the second resistance variable memory element, which is provided on the semiconductor substrate, in which the second resistance variable memory element has a write current that is smaller than a write current of the first resistance variable memory element, and the second resistance variable memory element is disposed farther from the semiconductor substrate than the first resistance variable memory element.

An integrated circuit device of the invention, includes: a first resistance variable memory element provided on a semiconductor substrate; a second resistance variable memory element provided on the semiconductor substrate; and a semiconductor circuit for controlling write and read of the first resistance variable memory element and the second resistance variable memory element, which is provided on the semiconductor substrate, in which the first resistance variable memory element has a write time that is shorter than a write time of the second resistance variable memory element, and the second resistance variable memory element is disposed farther from the semiconductor substrate than the first resistance variable memory element.

Advantageous Effects of Invention

According to the invention, it is possible to improve an operation efficiency of an integrated circuit device in which an MTJ element is disposed in a multi-layer state.

DESCRIPTION OF EMBODIMENTS

First Embodiment

In a first embodiment, an MTJ element (a magnetic tunnel junction element) of a spin orbit writing type and an MTJ element of a spin injection magnetization reversal type are disposed on a semiconductor substrate in a multi-layer state, the MTJ element of the spin injection magnetization reversal type having a relatively long write time is disposed in a position farther from the semiconductor substrate than the MTJ element of the spin orbit writing type having a short write time.

Figure 1:
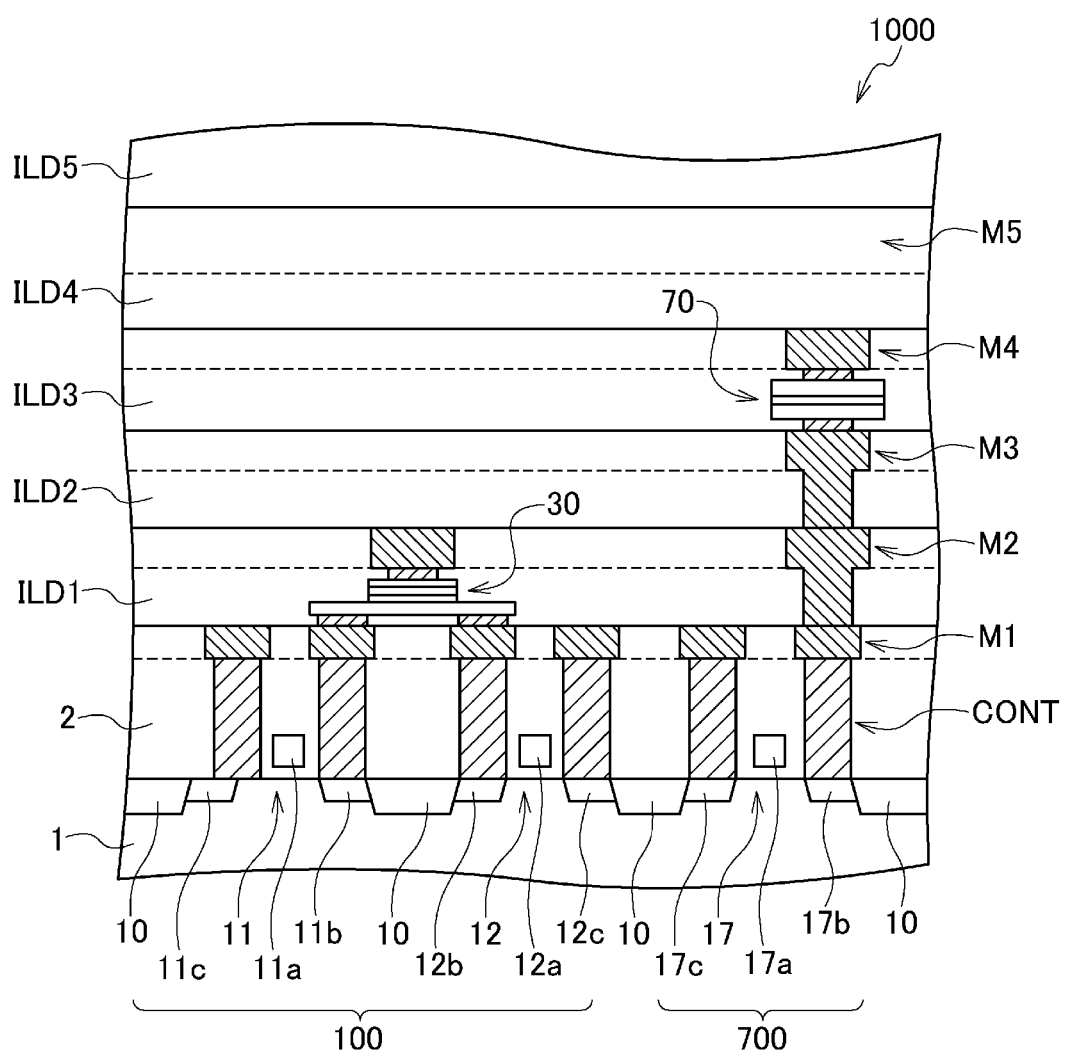
FIG. 1 is a sectional schematic view illustrating an integrated circuit device of a first embodiment.

As schematically illustrated in FIG. 1, a nonvolatile first memory cell 100 and a nonvolatile second memory cell 700 are provided on a semiconductor substrate 1, and thus, an integrated circuit device 1000 is configured. Note that, in FIG. 1, only one first memory cell 100 and only one second memory cell 700 are illustrated, but in actuality, a plurality of first memory cells 100 and a plurality of second memory cells 700 are disposed into the shape of a matrix or for each of a plurality of functional blocks. In addition, in FIG. 1, hatching is omitted with respect to a sectional surface other than metal wiring (including a through hole) and a contact hole. In addition, the dimensional ratio of each part illustrated in the drawing is different from that of the actuality.

The first memory cell 100 is provided with an MTJ element 30 of a spin orbit writing (spin orbital torque: SOT) type as a first resistance variable memory element, and a semiconductor circuit including transistors 11 and 12 that control the write and read of the MTJ element 30. In addition, the second memory cell 700 is provided with an MTJ element 70 of a spin injection magnetization reversal (spin transfer torque: STT) type as a second resistance variable memory element, and a semiconductor circuit including a transistor 17 that controls the write and read of the MTJ element 70. In this example, the transistors 11 and 12 are used as a selection transistor of the first memory cell 100, and the transistor 17 is used as a selection transistor of the second memory cell 700.

Metal wiring layers M1 to M5, a lower insulating layer 2 that covers the surface of the semiconductor substrate 1, and interlayer insulating films ILD1 to ILD5 that electrically insulate the metal wiring layers from each other are provided on the semiconductor substrate 1. The metal wiring layers M1 to M5 are stacked in the order of the metal wiring layers M1, M2, M3, M4, and M5 from the lower insulating layer 2 side, and the interlayer insulating films ILD1 to ILD5 are stacked in the order of ILD1, ILD2, ILD3, ILD4, and ILD5 from the lower insulating layer 2 side.

The transistors 11, 12, and 17, for example, are an N-type MOSFET, and is formed on the surface of the semiconductor substrate 1 by a general CMOS process. The transistors 11, 12, and 17 are electrically separated from each other by an element isolation region 10. The transistor 11 includes a gate 11a that is formed on the surface of the semiconductor substrate 1 and is embedded in the lower insulating layer 2, and a drain 11b and a source 11c that are formed on the surface of the semiconductor substrate 1. Similarly, the transistor 12 includes a gate 12a, a drain 12b, and a source 12c, and the transistor 17 includes a gate 17a, a drain 17b, and a source 17c.

Both of the MTJ element 30 and the MTJ element 70 are provided on the semiconductor substrate 1, and the MTJ element 70 having a relatively long write time is disposed farther from the semiconductor substrate 1 than the MTJ element 30 having a short write time, on the basis of a difference in a write time due to a difference in a writing method. Here, disposing the MTJ element 70 farther from the semiconductor substrate 1 than the MTJ element 30 indicates that a distance between the surface of the semiconductor substrate 1 and the MTJ element 70 (a length between the surface of the semiconductor substrate 1 and the MTJ element 70 in a normal direction of the surface of the semiconductor substrate 1) is larger than a distance between the surface of the semiconductor substrate 1 and the MTJ element 30 (a length between the surface of the semiconductor substrate 1 and the MTJ element 30 in the normal direction of the surface of the semiconductor substrate 1).

Specifically, the MTJ element 30 is disposed on the metal wiring layer M1 and is embedded in the interlayer insulating film ILD1, and the MTJ element 70 is disposed on the metal wiring layer M3 and is embedded in the interlayer insulating film ILD3. Accordingly, in the case of comparing the MTJ element 30 with the MTJ element 70, the MTJ element 30 is disposed in a position close to the semiconductor substrate 1 on which the corresponding semiconductor circuit (the transistors 11 and 12) is formed such that a wiring length with respect to the semiconductor circuit decreases, and the MTJ element 70 is disposed in a position away from the semiconductor substrate 1 on which the corresponding semiconductor circuit (the transistor 17) is formed such that a wiring length with respect to the semiconductor circuit increases.

Here, disposing the MTJ element 30 on the metal wiring layer M1 and disposing the MTJ element 70 on the metal wiring layer M3 are merely an example, and the disposition can be suitably set within a range not departing from the essence of the invention. For example, there may be M5 or more metal wiring layers, in accordance with the design of the semiconductor substrate, or the MTJ element 30 may be disposed higher than the metal wiring layer M2, and the MTJ element 70 may be disposed higher than the metal wiring layer M5. Note that, the same applies to the other embodiments described below.

Figure 2:
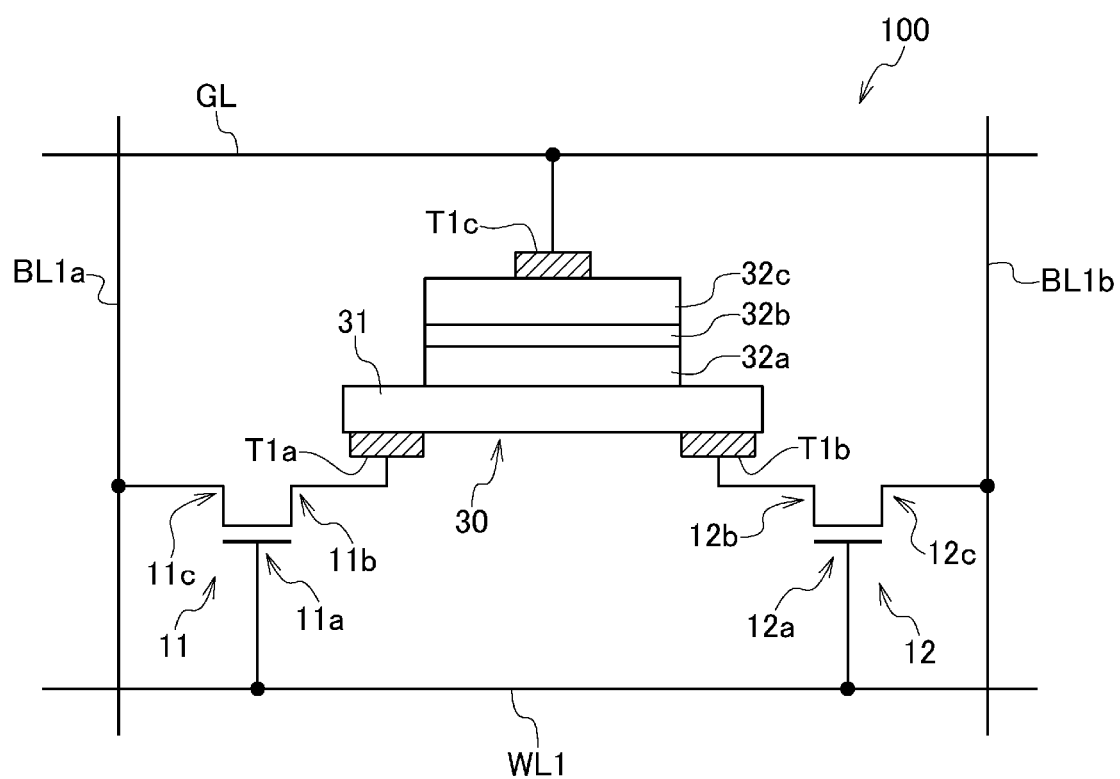
FIG. 2 is a circuit diagram illustrating a circuit of a first memory cell.

As illustrated in FIG. 2, the MTJ element 30 of the first memory cell 100 has a stacked structure in which a channel layer 31, a recording layer 32a, a barrier layer 32b, and a reference layer 32c are stacked in this order on the metal wiring layer M1, and the stacked structure is embedded in the interlayer insulating film ILD1. The channel layer 31 is in the shape of a plate extending in one direction, and the recording layer 32a, the barrier layer 32b, and the reference layer 32c are stacked in the central portion. The channel layer 31 may include an antiferromagnetic material that is a conductive layer, and the recording layer 32a and the reference layer 32c are formed of ferromagnetic material. In the recording layer 32a, for example, the magnetization is directed toward a direction perpendicular to the film surface (an up-and-down direction of FIG. 2). The recording layer 32a has an easy axis of magnetization in the direction perpendicular to the film surface, in which the direction of the magnetization can be changed to either a parallel state in a direction identical to that of the reference layer 31a or an anti-parallel state in a direction reverse to that of the reference layer 31a, by using spin orbit torque. The barrier layer 32b is formed of non-magnetic insulating material. Note that, as another aspect, the magnetization of the reference layer 32c, for example, may be directed toward a direction in the film surface (a right-and-left direction of FIG. 2), and the recording layer 32a may have an easy axis of magnetization in the direction in the film surface, in which the direction of the magnetization may be changed to either the parallel state in the direction identical to that of the reference layer 31a or the anti-parallel state in the direction reverse to that of the reference layer 31a, by using the spin orbit torque.

The MTJ element 30 is a three-terminal element, and includes terminals T1a, T1b, and T1c. The terminals T1a and T1b are separately provided on both ends of the channel layer 31 in a longitudinal direction, on the surface of the channel layer 31 on a side opposite to a surface to which the recording layer 32a is connected. The terminal T1c is provided on the surface of the reference layer 32c on a side opposite to a surface on which the barrier layer 32b is formed. The terminals T1a, T1b, and T1c may be in the form of a conductive layer containing a conductive material, or may be in the form in which an opening portion is provided in the interlayer insulating film ILD1 and the metal wiring layers M1 and M2 are directly in contact with each other.

The terminal T1a provided on the channel layer 31 is connected to the drain 11b of the transistor 11 through the metal wiring layer M1 and a contact hole CONT (refer to FIG. 1), and the terminal T1b is connected to the drain 12b of the transistor 12 through the metal wiring layer M1 and the contact hole CONT. In addition, the terminal T1c provided on the reference layer 32c is connected to a ground line GL that is embedded as the metal wiring layer M2.

The first memory cell 100 includes a pair of first bit line BL1a and first bit line BL1b that are embedded as the metal wiring layer M1, and the first bit line BL1a is connected to the source 11c of the transistor 11, and the first bit line BL1b is connected to the source 12c of the transistor 12, through each contact hole CONT. The gate 11a of the transistor 11 and the gate 12a of the transistor 12 are respectively connected to a first word line WL1. When the write and read of the first memory cell 100 are performed, the transistors 11 and 12 are turned on by the activation of the first word line WL1. Note that, the first bit line BL1a and the first bit line BL1b are described as the metal wiring layer M1, and the ground line GL is described as the metal wiring layer M2, but the metal wiring layer to be used can be suitably set insofar as the connections on the circuit are the same.

When data ("1" or "0") is written in the MTJ element 30, a write current is applied between the terminal T1a and the terminal T1b, and the data is stored by changing a magnetization direction of the recording layer 32a in accordance with the action of the spin orbit torque. That is, the write current is applied to the channel layer 31, and thus, in the channel layer 31, a spin current according to the direction of the write current occurs in the direction perpendicular to the film surface (the up-and-down direction of FIG. 2), and the spin orbit torque acts on the recording layer 32a. The spin orbit torque acts on the recording layer 32a to which a steady magnetic field from the channel layer 31 is applied, and thus, the magnetization direction of the recording layer 32a is changed to either a direction identical to that of the reference layer 32c (a parallel state) or a direction reverse to that of the reference layer 32c (an anti-parallel state), in accordance with the direction of the spin current. 1-Bit data of "0" and "1" is assigned in advance in the magnetization direction of the recording layer 32a, and thus, the data can be stored in the MTJ element 30.

When the data is read from the MTJ element 30, a predetermined read voltage is applied between the terminal T1a (or the terminal T1b) and the terminal T1c, a read current is applied in a direction passing through the stacked structure of the recording layer 32a, the barrier layer 32b, and the reference layer 32c, and a high or low in resistance is determined from the read voltage and the read current, and thus, the 1-bit data stored in the MTJ element 30 is specified.

Figure 3:
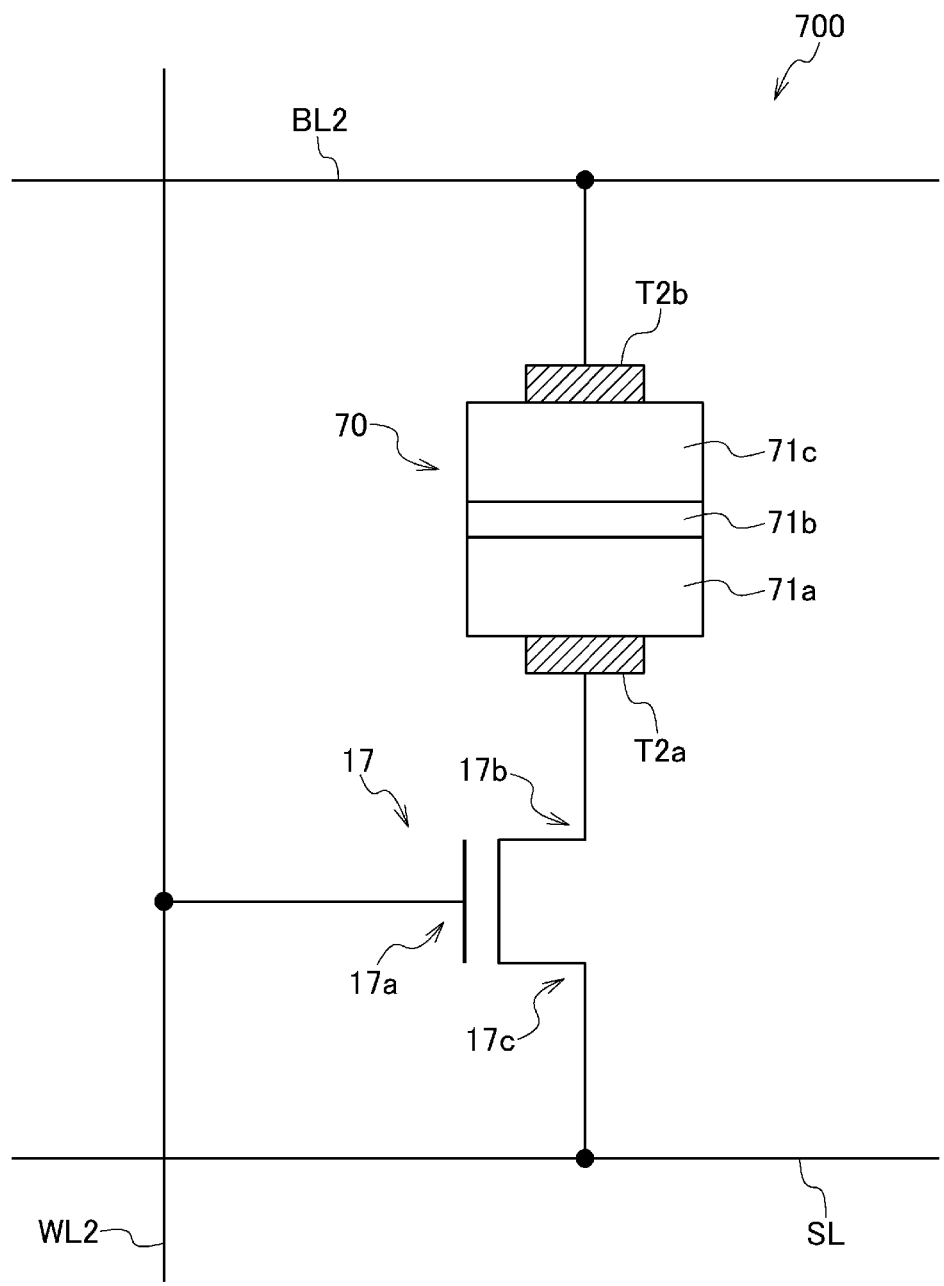
FIG. 3 is a circuit diagram illustrating a circuit of a second memory cell.

As illustrated in FIG. 3, the MTJ element 70 of the second memory cell 700 has a stacked structure in which a reference layer 71a, a barrier layer 71b, and a recording layer 71c are stacked in this order from the semiconductor substrate 1 side, and the stacked structure is provided on the metal wiring layer M3 and is embedded in the interlayer insulating film ILD3. The reference layer 71a, the barrier layer 71b, and the recording layer 71c are identical to the reference layer 32c, the barrier layer 32b, and the recording layer 32a of the MTJ element 30. The MTJ element 70 of the second memory cell 700 may have a stacked structure in which the recording layer 71c, the barrier layer 71b, and the reference layer 71a are stacked in this order from the semiconductor substrate 1 side.

The MTJ element 70 is a two-terminal element including terminals T2a and T2b. The terminal T2a is provided on the surface of the reference layer 71a on a side opposite from a surface on which the barrier layer 71b is formed. On the other hand, the terminal T2b is provided on the surface of the recording layer 71c on a side opposite from the surface on which the barrier layer 71b is formed. Note that, the terminals T2a and T2b may be in the form of a conductive layer containing a conductive material, or may be in the form in which an opening portion is provided in the interlayer insulating film ILD3 and the metal wiring layers M3 and M4 are directly in contact with each other.

The terminal T2a provided on the reference layer 71a side is connected to the drain 17b of the transistor 17 through the metal wiring layers M3, M2, and M1 and the contact hole CONT. In addition, the source 17c of the transistor 17 is connected to a source line SL that is embedded as the metal wiring layer M1. On the other hand, the terminal T2b provided on the recording layer 71c side is connected to a second bit line BL2 that is embedded as the metal wiring layer M4. In addition, the gate 17a of the transistor 17 is connected to a second word line WL2. Note that, the second bit line BL2 is described as the metal wiring layer M4, and the source line SL is described as the metal wiring layer M1, but the metal wiring layer to be used can be suitably set insofar as the connections on the circuit are the same.

When data is written in the MTJ element 70, a write current in a direction according to data to be written is applied between the terminal T2b and the terminal T2a, the data is stored by changing a magnetization direction of the recording layer 71c in accordance with the spin torque of electrons that are injected. The magnetization direction of the recording layer 71c can be changed to either a direction identical to that of the reference layer 71a or a direction reverse to that of the reference layer 71a, in accordance with the direction of the write current.

When the data is read from the MTJ element 70, a predetermined read voltage is applied between the terminal T2a and the terminal T2b, a read current passing through the stacked structure of the reference layer 71a, the barrier layer 71b, and the recording layer 71c is applied, and a high or low in resistance is determined from the read voltage and the read current, and thus, the 1-bit data stored in the MTJ element 70 is specified.

In the case of comparing the MTJ element 30 of the spin orbit writing type with the MTJ element 70 of the spin injection magnetization reversal type, the MTJ element 30 has a write time shorter than that of the MTJ element 70. Specifically, the write time of the MTJ element 30 is 0.1 ns to 10 ns, whereas the write time of the MTJ element 70 is long, which is 0.5 ns to 200 ns.

As described above, the MTJ element 30 is disposed in a position relatively close to the semiconductor substrate 1, and thus, a wiring length of connection wiring to be connected to the transistors 11 and 12 is relatively short, and a wiring delay of the MTJ element 30 (=Wiring Resistance× Wiring Capacitance) is relatively small. Accordingly, an operation speed of the MTJ element 30 is less affected by the wiring delay.

On the other hand, the MTJ element 70 is disposed relatively away from the semiconductor substrate 1, and thus, a wiring length of connection wiring to be connected to the transistor 17 is relatively long, and a wiring delay of the MTJ element 70 is relatively large. Definitely, it is desirable that the influence of the wiring delay on the MTJ element 70 is small, but the write of the MTJ element 70 is relatively slower than that of the MTJ element 30, and thus, the influence of the wiring delay is small.

As described above, in the integrated circuit device 1000, the MTJ element 70 in which the write time is relatively long and the influence of the wiring delay is relatively small is disposed away from the semiconductor substrate 1, and the MTJ element 30 is disposed such that the wiring delay is relatively small in order to utilize a high-speed operation of the MTJ element 30.

For example, examples of a preferred utilization form of the MTJ element 30 include a nonvolatile primary cache memory requiring a high-speed operation. In MTJ element 70, the operation is slow, but both of the write and the read can be controlled by one transistor 17, and thus, the MTJ element 70 is advantageous from the viewpoint of a transistor occupied area, and examples of a preferred utilization form thereof include a nonvolatile secondary cache memory that has capacity larger than that of the primary cache memory and is required to be highly integrated.

In the configuration described above, it is preferable that the write current of the MTJ element 70 that is disposed away from the semiconductor substrate 1 is relatively smaller than the write current of the MTJ element 30 that is close to the semiconductor substrate 1. As described above, in the MTJ element 70 that is disposed away from the semiconductor substrate 1, the wiring length of the connection wiring to be connected to the transistor 17 is relatively long, and thus, a time for applying the write current increases, but an increase in the power consumption is suppressed by decreasing the write current. On the other hand, in the MTJ element 30 that is disposed close to the semiconductor substrate 1, the write current is relatively large, but the wiring length of the connection wiring to be connected to the transistors 11 and 12 is relatively short, and thus, the time for applying the write current may decrease, and therefore, an increase in the power consumption is suppressed. As a result thereof, in the integrated circuit device 1000, the power consumption is suppressed, and an operation efficiency is improved. Note that, in integrated circuit devices of other embodiments described below, in a case where the write current of the MTJ element that is disposed away from the semiconductor substrate is relatively smaller than the write current of the MTJ element that is close to the semiconductor substrate, the power consumption can be suppressed, and the operation efficiency can be improved.

The MTJ element 70 has a long write time, and thus, the amount of current consumption (=Write Current Value× Write Time) decreases in a case where the write current is small. In this case, the MTJ element 30 has a write current that is larger than that of the MTJ element 70, but has a short write time, and thus, the amount of current consumption is small. Therefore, it is advantageous to set the write current of the MTJ element 70 to be smaller than the write current of the MTJ element 30, in order to attain low power consumption of the integrated circuit device 1000. In addition, the MTJ element 30 requiring a high-speed operation is disposed close to the semiconductor substrate 1, and thus, a space for extending wiring can be provided above the MTJ element 30. The space can be used as a region for enhancing a power supply line of the first memory cell 100 and a circuit driving the first memory cell 100 and for running the backing wiring for low resistance of a control signal line, and thus, disposing the MTJ element 30 close to the semiconductor substrate 1 further contributes to a high-speed operation.

Second Embodiment

In a second embodiment, an MTJ element having the same specification of the spin injection magnetization reversal type is disposed on the semiconductor substrate in a multi-layer state, and in a write current of the MTJ element disposed relatively away from the semiconductor substrate and a write current of the MTJ element close to the semiconductor substrate, the write current of the former is smaller than that of the latter. Note that, the second embodiment is the same as the first embodiment except for the following description, the same reference numerals will be applied to substantially the same configuration members, and the detailed description thereof will be omitted.

Figure 4:
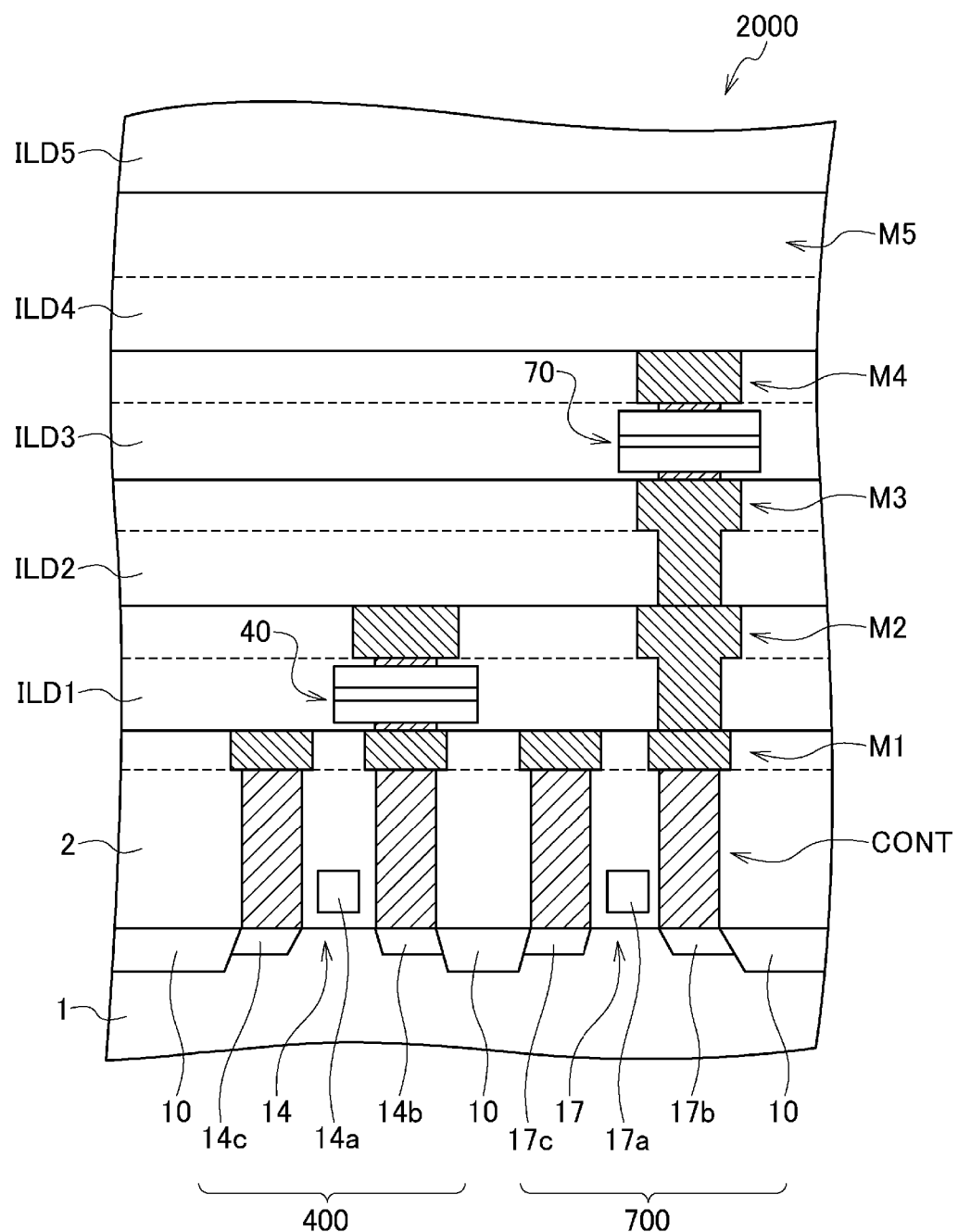
FIG. 4 is a sectional schematic view illustrating an integrated circuit device of a second embodiment.

As illustrated in FIG. 4, in an integrated circuit device 2000, a nonvolatile first memory cell 400 and the nonvolatile second memory cell 700 are provided on the semiconductor substrate 1. The first memory cell 400 includes an MTJ element 40 of a spin injection magnetization reversal type as the first resistance variable memory element, and a semiconductor circuit including a transistor 14 that controls the write and read of the MTJ element 40. In addition, the second memory cell 700 includes the MTJ element 70 of the spin injection magnetization reversal type as the second resistance variable memory element, and the semiconductor circuit including the transistor 17 that controls the write/read of the MTJ element 70. In the integrated circuit device 2000, the configuration and the disposition of the MTJ element 70, the connection with respect to the transistor 17, and the like are the same as those of the first embodiment.

The MTJ element 40 is a two-terminal element having the same dimension and the same vertical structure as those of the MTJ element 70. The MTJ element 40 is disposed on the metal wiring layer M1 and is embedded in the interlayer insulating film ILD1, in which one terminal is connected to a drain 14b of the transistor 14 through the metal wiring layer M1 and the contact hole CONT, and the other terminal is connected to the first bit line (not illustrated) that is embedded as the metal wiring layer M2. A gate 14a of the transistor 14 is connected to the first word line (not illustrated), and a source 14c is connected to the source line that is embedded as the metal wiring layer M1. A circuit configuration and the operation of the MTJ element 40 and the transistor 14 that are connected as described above are the same as those of the MTJ element 70.

As described above, in the integrated circuit device 2000 on which the MTJ elements 40 and 70 are disposed, the MTJ element 40 and the MTJ element 70 are provided on the semiconductor substrate 1, the MTJ element 40 is disposed relatively close to the semiconductor substrate 1, and the MTJ element 70 is disposed relatively away from the semiconductor substrate 1. In the MTJ element 40 and the MTJ element 70 that are disposed as described above, a write current at the time of writing data is relatively large in the former, and is relatively small in the latter. In addition, in such a write current, a pulse width of the write current with respect to the MTJ element 40 is shorter than that of the MTJ element 70, and thus, a high-speed operation is attained (a write time is shortened). Note that, the write current is adjusted in accordance with an increase or decrease in a voltage that is applied to the MTJ elements 40 and 70 from the power supply circuit.

Here, a factor for determining a write speed (time) of the MTJ element will be described with reference to expressions. A switching probability P of the MTJ element of the spin injection magnetization reversal type is represented by Expression (1). In Expression (1), a pulse width T of the write current of the MTJ element is represented by Expression (2). A method for shortening the pulse width T of the current, that is, the write time when the switching probability P is set to "1", that is, a probability that the magnetization direction of the recording layer is reversed is set to 100% will be described below. The write time is a minimum time required for reversing the magnetization direction of the recording layer.

$$P = 1 - \exp\left\{-\frac{\tau}{\tau_0}\exp\left[-\Delta\left(1 - \frac{1}{I_{C0}}\right)\right]\right\} \quad (1)$$

$$\tau = -\tau_0 \ln(1-P)\exp\left[\Delta - \frac{\Delta}{I_{C0}}I\right] \quad (2)$$

Here, in Expression (1) and Expression (2), $\tau_0$ is an inverse number of an attempt frequency, and is $10^{-9}$ seconds. $\Delta$ is thermal stability of the recording layer, and is an index of a data retention time. $I_{C0}$ is a critical current, and is a current necessary for write. $\Delta/I_{C0}$ represents a switching efficiency, and a large value indicates that it is possible to perform write with respect to the recording layer having high thermal stability with a small current.

In a case where the magnetization of the recording layer and the reference layer is directed toward a perpendicular direction, the switching efficiency $\Delta/I_{C0}$ described above is represented by Expression (3). In addition, a spin transfer efficiency $g(\theta)$ depending on a relative angle $\theta$ of the magnetization of the recording layer and the reference layer is represented by Expression (4).

$$\Delta/I_{C0} = \frac{\mu_B g(\theta)}{2\alpha\gamma e k_B T} \quad (3)$$

$$g(\theta) = \frac{P_{spin}}{1 + P_{spin}^2 \cos\theta} \quad (4)$$

Here, $\alpha$ represents a damping constant of the recording layer, $\gamma$ represents a magnetic gyro constant, e represents an elementary electric charge, $k_B$ represents a Boltzmann constant, T represents an absolute temperature, $\mu_B$ represents a Bohr magneton, $P_{spin}$ represents a spin polarizability. In a case where $P_{spin}$ of the reference layer is the same as $P_{spin}$ of the recording layer, $P_{spin}$ and a TMR ratio are in a relationship of Expression (5). In Expression (5), $R_{AP}$ and $R_P$ are a resistance value when the magnetization of the reference layer and the magnetization of the recording layer are in the anti-parallel state and the parallel state.

$$TMR \text{ ratio} = \frac{R_{AP} - R_P}{R_P} = \frac{2P_{spin}^2}{1 - P_{spin}^2} \quad (5)$$

In order to shorten the pulse width τ of the write current, that is, to shorten the write time, the current I may be increased or the switching efficiency $\Delta/I_{C0}$ may be increased. In order to increase the switching efficiency $\Delta/I_{C0}$, the relative angle θ of the magnetization between the recording layer and the reference layer may be increased by changing the element structure of the MTJ element.

In the second embodiment, the MTJ element 40 and the MTJ element 70 have the same dimension and the same vertical structure, and thus, have the same switching efficiency $\Delta/I_{C0}$, but as described above, the write current of the MTJ element 70 away from the semiconductor substrate 1 is relatively smaller than the write current of the MTJ element 40 close to the semiconductor substrate 1, and thus, the condition described above is satisfied in which the write current I of the MTJ element 40 is relatively increased.

According to Expression (2), the write current I of the MTJ element 40 is relatively increased, and thus, the pulse width τ of the write current of the MTJ element 40 can be relatively shortened (the write time can be relatively shortened).

In the integrated circuit device 2000 configured as described above, as with the first embodiment, the MTJ element 40 is disposed in a position that is relatively close to the semiconductor substrate 1, the wiring length of the connection wiring to be connected to the transistor 14 is relatively short, and the wiring delay of the MTJ element 40 is relatively small. Accordingly, in the MTJ element 40, the operation speed is less affected by the wiring delay. In addition, the MTJ element 70 is disposed relatively away from the semiconductor substrate 1, and thus, the wiring delay is relatively large, but the write is relatively slow, and thus, the influence of the wiring delay is small. Therefore, in the integrated circuit device 2000, the MTJ element 70 in which the write time is relatively long and the influence of the wiring delay is relatively small is disposed away from the semiconductor substrate 1, and the MTJ element 40 is disposed such that the wiring delay is relatively small in order to utilize a high-speed operation of the MTJ element 40.

In the integrated circuit device 2000, the MTJ element 70 has a relatively long write time, but has a small write current, and thus, the amount of current consumption due to the operation of the MTJ element 70 is small, and the MTJ element 40 has a write current larger than that of the MTJ element 70, but has a short write time, and thus, the amount of current consumption is small. Therefore, in the integrated circuit device 2000, an operation efficiency according to the operation speed and an operation efficiency according to the power are improved.

Third Embodiment

In a third embodiment, an MTJ element of a spin injection magnetization reversal type, having a small junction area, is disposed relatively close to the semiconductor substrate, and an MTJ element of a spin injection magnetization reversal type, having a large junction area, is disposed in a position away from the semiconductor substrate. Note that, the third embodiment is the same as the second embodiment except for the following description, the same reference numerals will be applied to substantially the same configuration members, and the detailed description thereof will be omitted.

Figure 5:
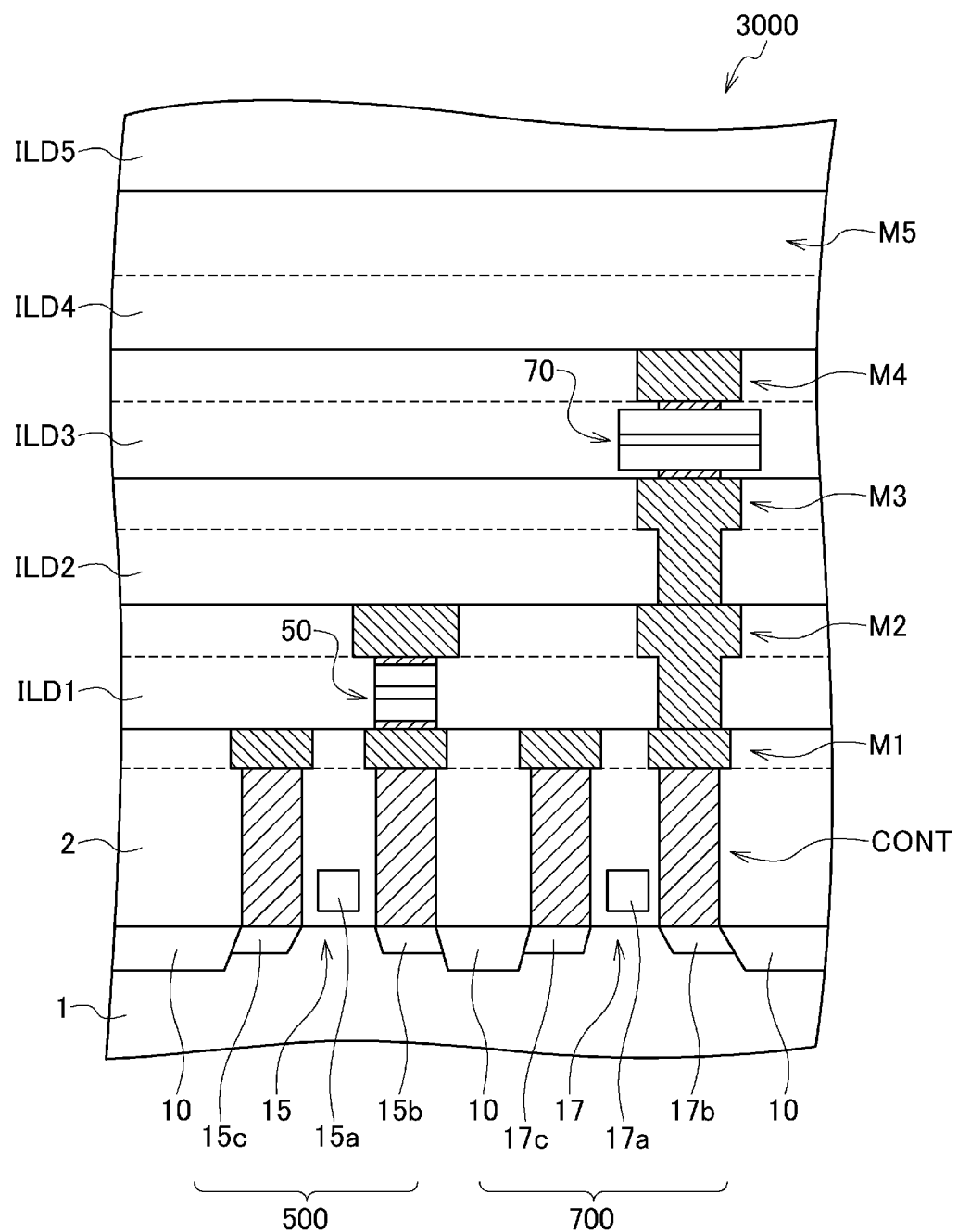
FIG. 5 is a sectional schematic view illustrating an integrated circuit device of a third embodiment.

As illustrated in FIG. 5, in an integrated circuit device 3000, a nonvolatile first memory cell 500 and the nonvolatile second memory cell 700 are provided on the semiconductor substrate 1. The first memory cell 500 includes an MTJ element 50 of a spin injection magnetization reversal type as the first resistance variable memory element, and a semiconductor circuit including a transistor 15 that controls the write and read of the MTJ element 50. In addition, the second memory cell 700 includes the MTJ element 70 of the spin injection magnetization reversal type as the second resistance variable memory element, and the semiconductor circuit including the transistor 17 that controls the write and the read of the MTJ element 70. In the integrated circuit device 3000, the configuration and the disposition of the MTJ element 70, the connection with respect to the transistor 17, and the like are the same as those of the second embodiment.

The MTJ element 50 is a two-terminal element having the same vertical structure as that of the MTJ element 70. The MTJ element 50 is disposed on the metal wiring layer M1, is embedded in the interlayer insulating film ILD1, and is connected to the transistor 15. The connection between the MTJ element 50, and a gate 15a, a drain 15b, and a source 15c of the transistor 15 is the same as the connection between the MTJ element 40 and the transistor of the second embodiment, and thus, the detailed description thereof will be omitted.

As described above, in the integrated circuit device 3000 on which the MTJ elements 50 and 70 are disposed, the MTJ element 50 and the MTJ element 70 are provided on the semiconductor substrate 1, but the MTJ element 50 is disposed relatively close to the semiconductor substrate 1, and the MTJ element 70 is disposed relatively away from the semiconductor substrate 1. The junction area of the MTJ element 50 (an area in which the reference layer and the recording layer are joined through the barrier layer) is relatively smaller than the junction area of the MTJ element 70.

In the switching efficiency $\Delta/I_{C0}$, junction area dependency of the critical current $I_{C0}$ is greater than that of the thermal stability $\Delta$, and thus, in the case of decreasing the junction area, it is possible to increase the switching efficiency $\Delta/I_{C0}$, and according to Expression (3) and Expression (4) described above, it is possible to shorten the pulse width $\tau$ of the write current, that is, to shorten the write time.

The junction area of the MTJ element 50 is relatively smaller than that of the MTJ element 70, and thus, the write time of the MTJ element 50 can be shorter than the write time of the MTJ element 70. In this example, the pulse width $\tau$ of the write current is shortened, and thus, the write time of the MTJ element 50 is shorter than the write time of the MTJ element 70. As a result thereof, as with the second embodiment, in the integrated circuit device 3000, the MTJ element 70 in which the write time is relatively long and the influence of the wiring delay is relatively small is disposed away from the semiconductor substrate 1, and the MTJ element 50 is disposed such that the wiring delay is relatively small in order to utilize a high-speed operation. Note that, in this case, the write current of the MTJ element 50 and the write current of the MTJ element 70 may have the same magnitude.

In the integrated circuit device 3000, the write current of the MTJ element 50 disposed in a position close to the semiconductor substrate 1 is relatively increased, and thus, as represented by Expression (2), it is possible to further shorten the write time, in accordance with a synergetic effect obtained by relatively increasing the write current I.

As described above, in the MTJ element 50 and the MTJ element 70, the write current of the former is relatively increased, and the write current of the latter is relatively decreased, and thus, the MTJ element 70 has a relatively long write time, but has a small write current, and therefore, the amount of current consumption due to the operation of the MTJ element 70 is small, and the MTJ element 50 has a write current larger than that of the MTJ element 70, but has a short write time, and therefore, the amount of current consumption is small. Therefore, in the integrated circuit device 3000, an operation efficiency according to the operation speed and an operation efficiency according to the power are improved.

Fourth Embodiment

In a fourth embodiment, there is a difference in the number of reference layers between an MTJ element of a spin injection magnetization reversal type, disposed relatively close to the semiconductor substrate, and an MTJ element of a spin injection magnetization reversal type, disposed away from the semiconductor substrate. Note that, the fourth embodiment is the same as the third embodiment except that the MTJ element to be used in the first memory cell is different, the same reference numerals will be applied to substantially the same configuration members, and the detailed description thereof will be omitted.

Figure 6:
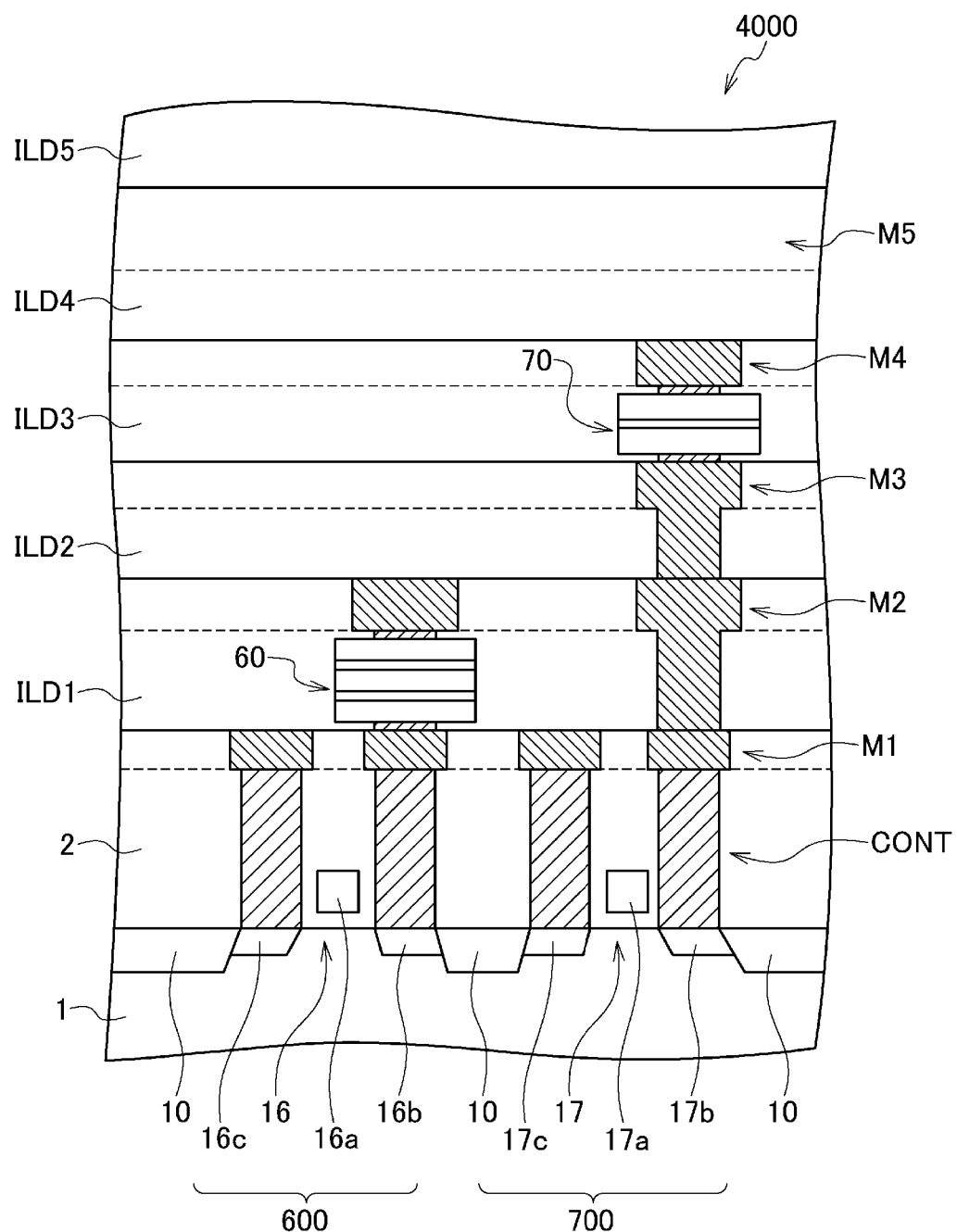
FIG. 6 is a sectional schematic view illustrating an integrated circuit device of a fourth embodiment.

As illustrated in FIG. 6, in an integrated circuit device 4000, a nonvolatile first memory cell 600 and the nonvolatile second memory cell 700 are provided on the semiconductor substrate 1. The first memory cell 600 includes an MTJ element 60 of a spin injection magnetization reversal type as the first resistance variable memory element, and a semiconductor circuit including a transistor 16 that controls the write and the read of the MTJ element 60. The second memory cell 700 includes the MTJ element 70, and the semiconductor circuit including the transistor 17.

The MTJ element 60 is disposed on the metal wiring layer M1, and is embedded in the interlayer insulating film ILD1. The MTJ element 60 is connected to the transistor 16. Therefore, the MTJ element 60 and the MTJ element 70 are provided on the semiconductor substrate 1, in which the MTJ element 60 is disposed relatively close to the semiconductor substrate 1, and the MTJ element 70 is disposed relatively away from the semiconductor substrate 1.

Figure 7:
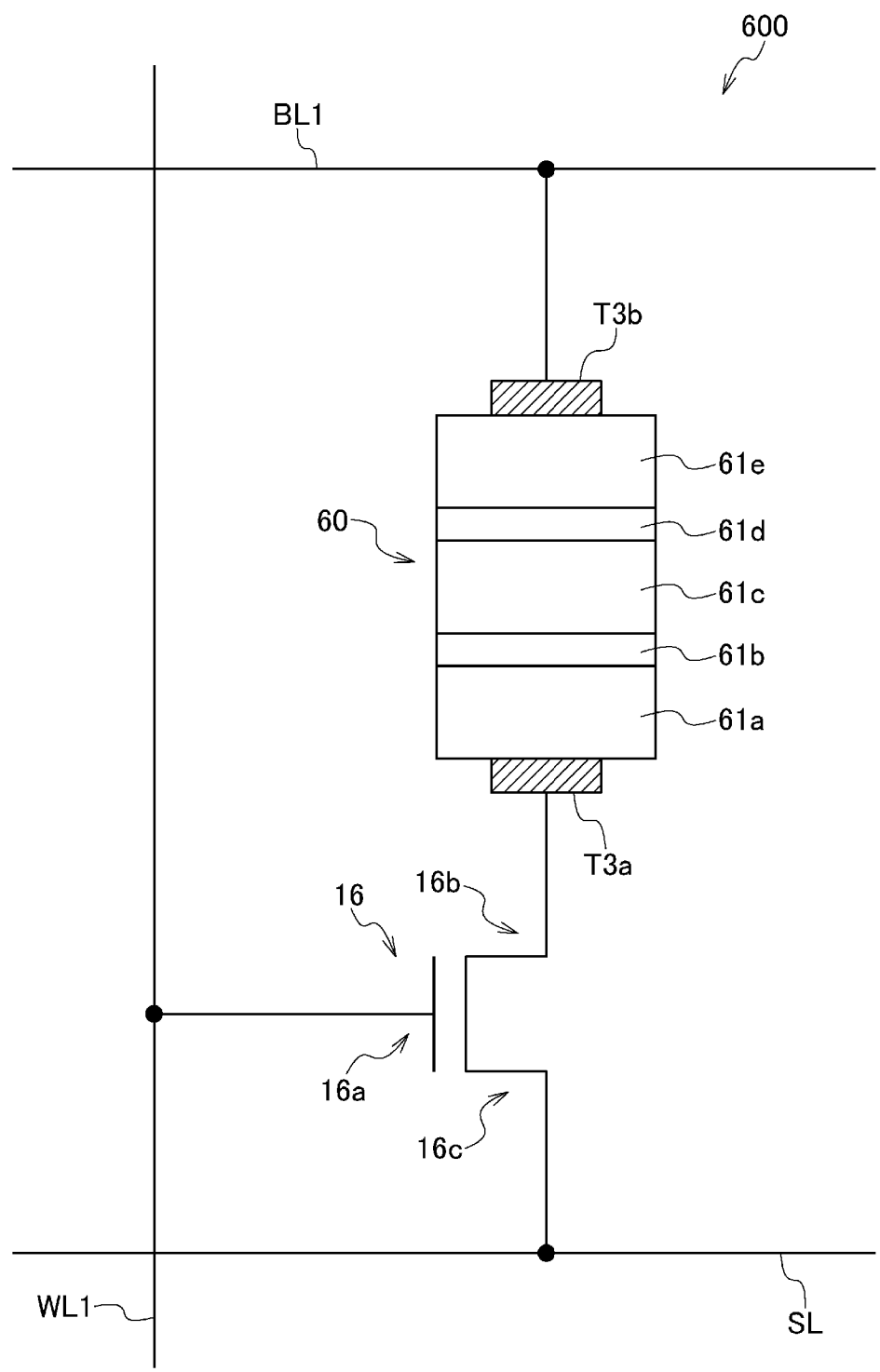
FIG. 7 is a circuit diagram illustrating a first memory cell of the fourth embodiment.

As illustrated in FIG. 7, the MTJ element 60 has a stacked structure in which a reference layer 61a, a barrier layer 61b, a recording layer 61c, a non-magnetic layer 61d, and a reference layer 61e are stacked in this order, and the stacked structure is embedded in the interlayer insulating film ILD1. The reference layers 61a and 61e and the recording layer 61c are formed of ferromagnetic material, and both of the barrier layer 61b and the non-magnetic layer 61d are a non-magnetic film and are formed non-magnetic insulating material. In both of the reference layers 61a and 61e, magnetization directions are fixed and are opposite to each other.

The MTJ element 70 has a stacked structure in which the reference layer 71a, the barrier layer 71b that is a non-magnetic film, and the recording layer 71c are stacked in this order, and the reference layer 71a is provided on only one surface of the recording layer 71c by interposing the non-magnetic film between the reference layer 71a and the recording layer 71c, whereas the MTJ element 60 has a stacked structure in which the reference layer is provided on both surfaces of the recording layer by interposing the non-magnetic film between the reference layer and the recording layer.

The MTJ element 60 is a two-terminal element including terminals T3a and T3b. The terminal T3a is provided on the surface of the reference layer 61a on a side opposite to a surface on which the barrier layer 61b is formed. The terminal T3b is provided on the surface of the reference layer 61e on a side opposite to a surface on which the non-magnetic layer 61d is formed. Note that, the terminals T3a and T3b may be in the form of a conductive layer containing a conductive material, or may be in the form in which an opening portion is provided in the interlayer insulating film and the metal wiring layers are directly in contact with each other.

The terminal T3a provided on the reference layer 61a, and is connected to a drain 16b of the transistor 16 through the metal wiring layers M3, M2, and M1 and the contact hole CONT. In addition, the terminal T2b provided on the reference layer 61e is connected to the first bit line BL1 that is embedded as the metal wiring layer M4. A gate 16a of the transistor 16 is connected to the first word line WL1. In addition, a source 16c of the transistor 16 is connected to the source line SL that is embedded as the metal wiring layer M1.

According to Expression (3) and Expression (4) described above, even in a case where the write currents are the same, it is possible to increase the switching efficiency $\Delta/I_{C0}$ and to shorten the pulse width $\tau$ of the write current, by increasing the relative angle $\theta$ of the magnetization between the recording layer and the reference layer. In a case where two reference layers are provided by interposing the recording layer therebetween in the MTJ element of the spin injection magnetization reversal type, the relative angle $\theta$ of the magnetization between the recording layer and the reference layer increases, and thus, it is possible to shorten the pulse width $\tau$ of the write current, that is, to shorten the write time.

Even in this example, the pulse width $\tau$ of the write current is shortened, and thus, the write time of the MTJ element 60 is shorter than the write time of the MTJ element 70. As a result thereof, as with the second embodiment, in the integrated circuit device 4000, the MTJ element 70 in which the write time is relatively long and the influence of the wiring delay is relatively small is disposed away from the semiconductor substrate 1, and the MTJ element 50 is disposed such that the wiring delay is relatively small in order to utilize a high-speed operation of the MTJ element 50. Note that, in this case, the write current of the MTJ element 50 and the write current of the MTJ element 70 may have the same magnitude.

In the integrated circuit device 4000, the write current of the MTJ element 60 disposed in a position close to the semiconductor substrate 1 is relatively increased, and thus, as represented in Expression (2), it is possible to further shorten the write time, in accordance with a synergetic effect obtained by relatively increasing the write current I.

As described above, in the MTJ element 60 and the MTJ element 70, the write current of the former is relatively increased, and the write current of the latter is relatively decreased, and thus, the MTJ element 70 has a relatively long write time, but has a small write current, and therefore, the amount of current consumption due to the operation of the MTJ element 70 is small, and the MTJ element 60 has a write current larger than that of the MTJ element 70, but has a short write time, and therefore, the amount of current consumption is small. Therefore, in the integrated circuit device 4000, an operation efficiency according to the operation speed and an operation efficiency according to the power are improved.

Fifth Embodiment

In a fifth embodiment, an MTJ element that is disposed relatively close to the semiconductor substrate and an MTJ element that is disposed away from the semiconductor substrate are respectively in a spin orbit writing type, and a write current of the MTJ element away from the semiconductor substrate is smaller than a write current of the MTJ element close to the semiconductor substrate. Note that, the fifth embodiment is the same as the first embodiment except that the MTJ element to be used in the second memory cell is different, the same reference numerals will be applied to substantially the same configuration members, and the detailed description thereof will be omitted.

Figure 8:
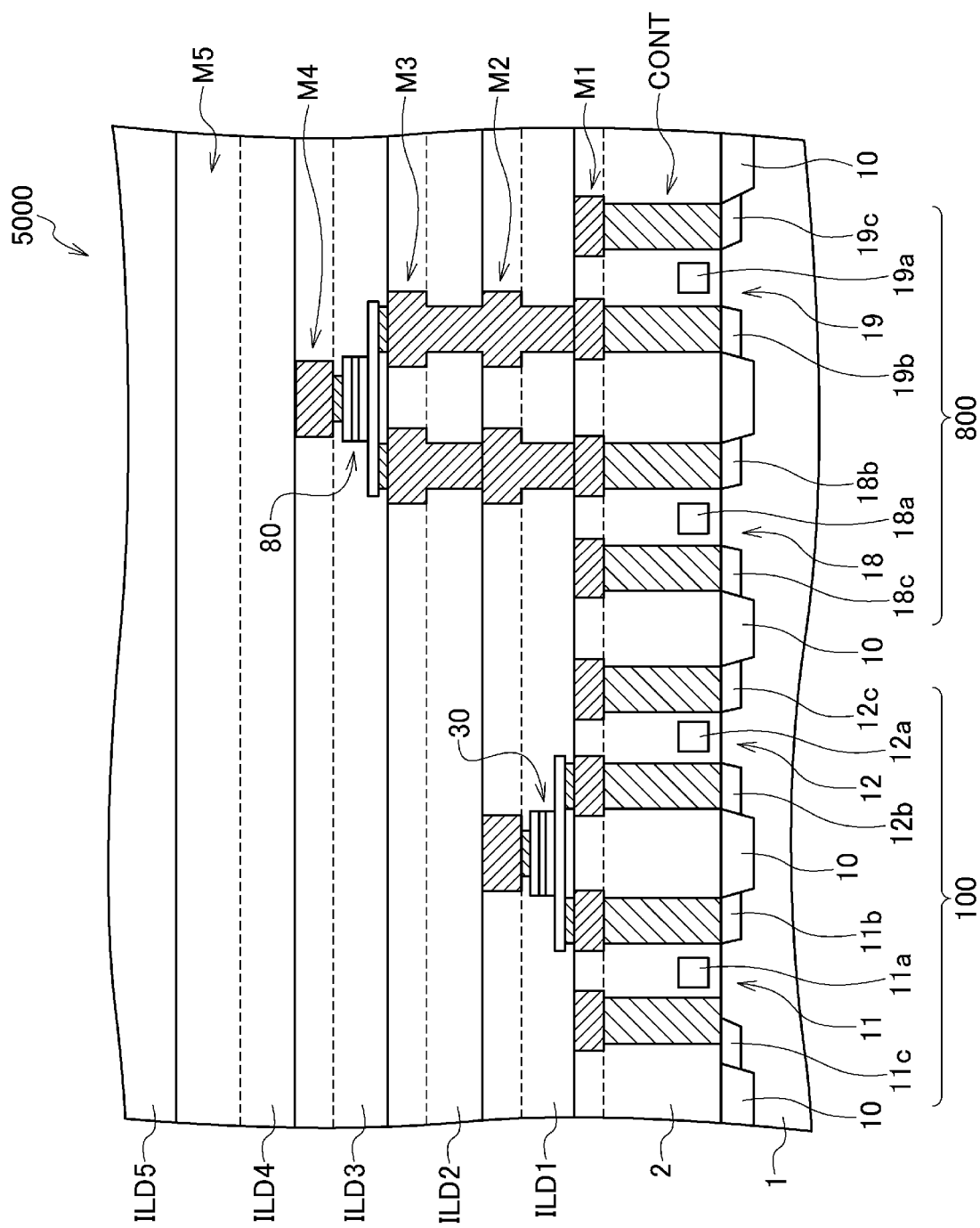
FIG. 8 is a sectional schematic view illustrating an integrated circuit device of a fifth embodiment.

As illustrated in FIG. 8, in an integrated circuit device 5000, the nonvolatile first memory cell 100 and a nonvolatile second memory cell 800 are provided on the semiconductor substrate 1. The first memory cell 100 includes the MTJ element 30 of the spin orbit writing type as the first resistance variable memory element, and the semiconductor circuit including the transistors 11 and 12 that control the write and read of the MTJ element 30. Similarly, the second memory cell 800 includes an MTJ element 80 of a spin orbit writing type as the second resistance variable memory element, and a semiconductor circuit including transistors 18 and 19 that control the write and read of the MTJ element 80.

The MTJ element 80 has the same structure as that of the MTJ element 30, is disposed on the metal wiring layer M3, and is embedded in the interlayer insulating film ILD3. Accordingly, the MTJ element 30 and the MTJ element 80 are provided on the semiconductor substrate 1, in which the MTJ element 30 is disposed relatively close to the semiconductor substrate 1, and the MTJ element 80 is disposed away from the semiconductor substrate 1. In the MTJ element 80, one terminal provided on the channel layer is connected to a drain 18b of the transistor 18 through the metal wiring layers M3, M2, and M1 and the contact hole CONT, and the other terminal T1b is connected to a drain 19b of the transistor 19 through the metal wiring layers M3, M2, and M1 and the contact hole CONT. In addition, the terminal provided on the reference layer is connected to the ground line that is embedded as the metal wiring layer M4. The second memory cell 800 includes a pair of second bit lines that are embedded as the metal wiring layer M1, and sources 18c and 19c of the transistors 18 and 19 are respectively connected to the pair of second bit lines through each of the contact holes CONT. Gates 18a and 19a of the transistors 18 and 19 are respectively connected to the second word lines. A circuit configuration, the operation, and the like of the second memory cell 800 are the same as those of the first memory cell 100, and thus, the detailed description thereof will be omitted.

In the fifth embodiment, in the MTJ element 80 disposed away from the semiconductor substrate 1 and the MTJ element 30 disposed close to the semiconductor substrate 1, the write current of the former is relatively decreased, and the write current of the latter is relatively increased. In the MTJ element of the spin orbit writing type, it is possible to shorten the write time in the case of increasing the write current. For this reason, the MTJ element 30 is disposed such that the wiring delay is relatively small in order to utilize a high-speed operation of the MTJ element 30, and is capable of further shortening the write time, in accordance with a synergetic effect obtained by relatively increasing the write current. The MTJ element 30 has a write current larger than that of the MTJ element 80, but has a short write time, and thus, the amount of current consumption is small. In addition, in the MTJ element 80, the operation speed is slightly decreased, but the current consumption of the integrated circuit device 5000 is considerably reduced while a higher operation speed (a shorter write time) is maintained. As described above, in the integrated circuit device 5000, the write current of the MTJ element 80 that is disposed away from the semiconductor substrate 1 is relatively decreased, and thus, the current consumption is considerably reduced, and an excellent operation efficiency is obtained. As described above, in the integrated circuit device 5000, an operation efficiency according to the operation speed and an operation efficiency according to the power are improved.

In the above description, some embodiments has been described, the invention is not limited to the configurations described above. For example, as with the integrated circuit device of the second embodiment, in the write currents of the MTJ element disposed relatively away from the semiconductor substrate and the MTJ element close to the semiconductor substrate, the write current of the former may be smaller than the write current of the latter, by using the MTJ element including two reference layers. Further, in the above description, two types of MTJs are disposed, but three or more types of MTJs may be disposed in a multi-stage state.

The resistance variable memory element is not limited to the MTJ element, and the data can be stored by using a difference in electrical resistance. For example, the resistance variable memory element may be a phase change element that is used in a phase change random access memory (PCRAM) and rewrites data by changing a phase state of a phase change material with Joule heat that is generated at the time of applying a current to a phase change material layer, a resistance variable element that is used in a resistive random access memory (resistive RAM: ReRAM) and changes a resistance value of an oxide layer of a memory cell by applying a voltage pulse, or the like. In such a phase change element or resistance variable element, a write time that is a time necessary for reversing data is large, compared to the MTJ element of various operation methods, such as a two-terminal element and a three-terminal element. For example, in a case where a phase change element having a write time of approximately 100 ns or a resistance variable element having a write time of approximately 50 ns, and an MTJ element having a write time of approximately 1 ns are mixed, the MTJ element having a short write time may be disposed relatively close to the surface of the semiconductor substrate, as the first resistance variable memory element, and the phase change element or the resistance variable element having a long write time may be disposed away from the surface of the semiconductor substrate, on a layer upper than the MTJ element, as the second resistance variable memory element.

The invention is also applied to a case where two or more layers of memory cells including a resistance variable memory element are provided on an integrated circuit device. For example, the invention may be applied to two layers that are arbitrarily selected from the multi-layer structure.

A method for forming a resistance variable memory element in a multi-layer state is not limited to a general process in which thin films are sequentially stacked on one silicon wafer, but multi-layer wiring including a resistance variable memory element may be formed on each of a plurality of substrates, and then, the multi-layer wiring may be bonded. In this case, a sectional surface of an integrated circuit device may be slightly different from the sectional surface described in the embodiments, and the integrated circuit device can be preferably designed on the basis of the invention.

REFERENCE SIGNS LIST

1 Semiconductor substrate
2 Lower insulating layer
10 Element isolation region
11, 12, 14, 15, 16, 17, 18, 19 Transistor
30, 40, 50, 60, 70, 80 Resistance variable memory element
31 Channel layer
32a, 61c, 71c Recording layer
32b, 61b, 71b Barrier layer
32c, 61a, 61e, 71a Reference layer
61d Non-magnetic layer
100, 200, 400, 500, 600, 700, 800 Memory cell
1000, 2000, 3000, 4000, 5000 Integrated circuit device
BL1a, BL1b, BL2 Bit line
CONT Contact hole
GL Ground line
ILD1, ILD2, ILD3, ILD4, ILD5 Interlayer insulating film
M1, M2, M3, M4, M5 Metal wiring layer
SL Source line
T1a, T1b, T1c, T2a, T2b, T3a, T3b Terminal
WL1, WL2 Word line

The invention claimed is:
1. An integrated circuit device, comprising:
a first memory cell including a first resistance variable memory element provided on a semiconductor substrate;

a second memory cell including a second resistance variable memory element provided on the semiconductor substrate; and a semiconductor circuit for controlling write and read of the first resistance variable memory element and the second resistance variable memory element, which is provided on the semiconductor substrate, wherein the second resistance variable memory element has a write current that is smaller than a write current of the first resistance variable memory element, and the second resistance variable memory element is disposed farther from the semiconductor substrate than the first resistance variable memory element.

2. The integrated circuit device according to claim 1, wherein the first resistance variable memory element is a magnetic tunnel junction element of a spin orbit writing type, and the second resistance variable memory element is a magnetic tunnel junction element of a spin injection magnetization reversal type.

3. The integrated circuit device according to claim 1, wherein each of the first resistance variable memory element and the second resistance variable memory element are a magnetic tunnel junction element of a spin injection magnetization reversal type.

4. The integrated circuit device according to claim 3, wherein the first resistance variable memory element has a junction area that is smaller than a junction area of the second resistance variable memory element.

5. The integrated circuit device according to claim 3, wherein the first resistance variable memory element has a stacked structure in which a reference layer is provided on each of both surfaces of a recording layer by interposing a non-magnetic film between the reference layer and the recording layer, and the second resistance variable memory element has a stacked structure in which a reference layer is provided on only one surface of a recording layer by interposing a non-magnetic film between the reference layer and the recording layer.

6. The integrated circuit device according to claim 1, wherein each of the first resistance variable memory element and the second resistance variable memory element are a magnetic tunnel junction element of a spin orbit writing type.

7. An integrated circuit device, comprising:

a first resistance variable memory element provided on a semiconductor substrate;

a second resistance variable memory element provided on the semiconductor substrate; and a semiconductor circuit for controlling write and read of the first resistance variable memory element and the second resistance variable memory element, which is provided on the semiconductor substrate, wherein the first resistance variable memory element has a write time that is shorter than a write time of the second resistance variable memory element, and the second resistance variable memory element is disposed farther from the semiconductor substrate than the first resistance variable memory element.

8. The integrated circuit device according to claim 7, wherein the first resistance variable memory element is a magnetic tunnel junction element of a spin orbit writing type, and the second resistance variable memory element is a magnetic tunnel junction element of a spin injection magnetization reversal type.

9. The integrated circuit device according to claim 7, wherein each of the first resistance variable memory element and the second resistance variable memory element are a magnetic tunnel junction element of a spin injection magnetization reversal type.

10. The integrated circuit device according to claim 9, wherein the first resistance variable memory element has a junction area that is smaller than a junction area of the second resistance variable memory element.

11. The integrated circuit device according to claim 9, wherein the first resistance variable memory element has a stacked structure in which a reference layer is provided on each of both surfaces of a recording layer by interposing a non-magnetic film between the reference layer and the recording layer, and the second resistance variable memory element has a stacked structure in which a reference layer is provided on only one surface of a recording layer by interposing a non-magnetic film between the reference layer and the recording layer.

* * * * *